United States Patent
Nagai et al.

(10) Patent No.: US 6,800,996 B2
(45) Date of Patent: *Oct. 5, 2004

(54) LIGHT EMITTING DEVICE, DISPLAY APPARATUS WITH AN ARRAY OF LIGHT EMITTING DEVICES, AND DISPLAY APPARATUS METHOD OF MANUFACTURE

(75) Inventors: Yoshifumi Nagai, Anan (JP); Yuichi Fujiwara, Anan (JP); Kunihiro Izuno, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/640,672

(22) Filed: Aug. 14, 2003

(65) Prior Publication Data

US 2004/0046222 A1 Mar. 11, 2004

Related U.S. Application Data

(62) Division of application No. 09/907,715, filed on Jul. 19, 2001, now Pat. No. 6,657,382.

(30) Foreign Application Priority Data

| Jul. 21, 2000 | (JP) | 2000-219932 |
| Jul. 3, 2001 | (JP) | 2001-202600 |
| Jul. 18, 2001 | (JP) | 2001-217915 |

(51) Int. Cl.[7] .............. H05B 33/02; F21V 3/04
(52) U.S. Cl. .............. 313/512; 362/311; 362/800
(58) Field of Search .............. 313/512, 498, 313/499, 112, 113, 116, 52–504; 315/169.3; 345/36, 45, 76; 428/690, 917; 362/355, 310, 311, 800; 257/89, 103, 98–101, 17, 72–74

(56) References Cited

U.S. PATENT DOCUMENTS

| 4,160,931 | A | | 7/1979 | Lambe |
| 4,907,044 | A | | 3/1990 | Schellhorn et al. |
| 5,218,268 | A | | 6/1993 | Matsuda et al. |
| 2,706,202 | A | | 4/1995 | Barnes |
| 5,789,854 | A | | 8/1998 | Takizawa et al. |
| 5,846,677 | A | | 12/1998 | Nomura et al. |
| 5,931,570 | A | | 8/1999 | Yamuro |
| 6,155,699 | A | * | 12/2000 | Miller et al. .......... 362/293 |
| 6,340,824 | B1 | | 1/2002 | Komoto et al. |
| 6,504,301 | B1 | * | 1/2003 | Lowery .................. 313/512 |

* cited by examiner

Primary Examiner—Ashok Patel
(74) Attorney, Agent, or Firm—Wenderoth, Lind & Ponack, L.L.P.

(57) ABSTRACT

A light emitting device and display apparatus using a plurality of light emitting devices can drastically reduce contrast loss due to light from an external source. The light emitting device has (a) light emitting chip(s) and a first layer covering the light emitting chip(s). A second layer including a light scattering material is provided at least over the first layer, and the surface of second layer has a plurality of protrusions which follow the topology of the light scattering material. The display apparatus is formed by disposing these light emitting devices in an array on a substrate.

9 Claims, 6 Drawing Sheets

LIGHT EMITTING DEVICE, DISPLAY APPARATUS WITH AN ARRAY OF LIGHT EMITTING DEVICES, AND DISPLAY APPARATUS METHOD OF MANUFACTURE

This application is a divisional application of U.S. Ser. No. 09/907,715, filed Jul. 19, 2001 now U.S. Pat. No. 6,657,382.

This application is based on applications No. 2000-219932 filed in Japan on Jul. 21, 2000, No. 2001-202600 filed in Japan on Jul. 3, 2001, and No. 2001-217915 filed in Japan on Jul. 18, 2001, the contents of which are incorporated hereinto by reference.

BACKGROUND OF THE INVENTION

1. Technical Field

This invention relates to a light emitting device and a display apparatus using a plurality of light emitting devices, and in particular to an improved light emitting device and display apparatus which reduces light reflection at the surface to increase display contrast.

2. Description of Related Art

Today, light emitting diodes (LED's) capable of emitting each of the RGB colors (red, green, blue) and LED's capable of emitting white light at high luminance have been developed. As a result, the LED display apparatus, made up of an array of a plurality of LED's, is being applied in various fields. Compared with a light bulb, an LED has an extremely long lifetime, high efficiency, and furthermore is resistant to vibration. These types of properties are being put to good use, for example, in display applications such as advertisements, travel destination directions, and highway information. LED's are also being adopted for use as light sources for traffic lights; and for display screens from miniature to very large scale.

In particular, in an LED display capable of full color presentation, a single pixel is represented either by a close arrangement of LED's capable of emitting each of the RGB colors or by a single LED containing a plurality of light emitting diode chips capable of emitting each of the RGB colors. In either case, one pixel is represented by the mixture of light from each light emitting diode chip. An LED display is constructed by connecting together LED display apparatus, which are arrays of a plurality of LED's, in a body or frame such as a poly-carbonate resin carrier. Specifically, by fixing each LED display apparatus in an installation frame provided, for example, on the wall of a building, and by electrically connecting each LED display apparatus, a single LED display can be constructed.

LED's are primarily of the surface mount type with leads that mount on the surface of a substrate, or of the type with leads that pass through the substrate for attachment. Surface mount LED leads are bent to form a plane parallel to the substrate surface. LED's of the later type are formed with leads which are perpendicular to the substrate surface.

Of the LED's which have leads that can be surface mounted, chip-type LED's have a favorable reputation. A typical chip-type LED is formed by die-bonding an LED chip to the surface at the bottom of a cavity in a liquid crystal polymer package with leads formed in the package. Wire-bonding is performed as required. Next, package encapsulating resin is introduced into the cavity to at least cover the LED chip. On the other hand, a single type of encapsulating resin may be used to enclose and fix in place an LED chip and leads without using a package.

Of the LED's which are attached by passing leads through a substrate, lamp-type LED's have a favorable reputation. A typical lamp-type LED is formed by die-bonding an LED chip to the surface at the bottom of a lead cavity. Wire-bonding is performed as required. Next, encapsulating resin covering the LED chip is formed, for example, in the shape of a bullet.

In the present state of the technology, primarily LED's with leads which pass through a substrate, such as lamp-type LED's, can pass more current and emit with more luminance than chip-type LED's, which surface mount on a substrate. For reasons such as these, display apparatus with lamp-type LED's arrayed on a substrate are used primarily in outdoor applications requiring high luminance. In cases where surface mount chip-type LED's are used in a display apparatus, light-weight and thin-panel construction are advantages over apparatus with lamp-type LED's with leads which pass through a substrate. Further, since chip-type LED display apparatus can realize a narrower pitch between pixels and higher density arrays, fine resolution image display can be achieved. For these reasons, display apparatus with chip-type LED's surface mounted on a substrate are used primarily indoors where the distance from the display apparatus to the observation point is short.

Incidentally, inorganic or organic light scattering material is included inside the encapsulating resin of the LED's described above. By this construction, the efficiency of light extraction from the LED chip towards the observer is vastly improved.

However, accompanying the current expansion of fields of application for LED's and display apparatus using a plurality of LED's, as well as the demand for higher quality display, further improvement to reduce display contrast degradation has become necessary whether indoors or outdoors.

Specifically, when an LED is illuminated, external light such as sunlight or artificial lighting incident at certain angles reflects primarily off the surface of the LED encapsulating resin resulting in degradation in the display contrast. Light reflection also occurs at light emitting device side-walls thereby causing further display contrast degradation problems.

Even when an LED is not illuminated, external light can shine on the upper and side surfaces on the observer's side of the LED. As a result, light can reflect off at least LED surfaces producing glare which appears white to the observer.

Clearly, in the case of an LED display apparatus with a plurality of LED's arrayed on a substrate, display contrast degradation can also occur for the same reasons described above. Further, external light not only reflects off LED surfaces but also off the substrate surface to reduce display contrast even more. Even when LED's are not illuminated and even when the substrate itself is, for example, colored with a dark color, the display apparatus itself can appear white because of external light reflected off the substrate or LED surfaces towards the observer.

Display quality of an LED or LED display apparatus is maintained by an inherent dark coloration such as black or dark blue. However, as a result of light reflection at the surface, not only is display contrast reduced, but LED and LED display apparatus quality loss due to glare and white appearance is a problem.

Inside an LED, light scattering material of relatively small particle size, such as silica, is included inside the encapsulating resin covering the LED chip to improve light producing efficiency. However, due to the influence of factors such as encapsulating resin surface tension and specific gravity of the encapsulating resin and the light scattering material, the light scattering material ends up completely encased in encapsulating resin after final hardening, and the surface of the encapsulating resin ends up with a smooth surface. For this reason, even though the extraction efficiency of light produced inside the device can be improved, external light striking the smooth surface of the encapsulating resin produces glare. Here, the term "smooth surface" refers to an encapsulating resin surface, as described above, with roughness insufficient to scatter light from an external source. Namely, protrusions formed in the encapsulating resin surface due to an inner layer of different material such as light scattering material are not sufficient to scatter light from an external source.

The present invention was developed considering the problems described above. Thus, it is an object of the present invention to provide a light emitting device and a display apparatus using a plurality of light emitting devices which can drastically reduce display contrast loss due to light from external sources. The above and further objects and features of the invention will be more fully apparent from the following detailed description in conjunction with the accompanying drawings.

SUMMARY OF THE INVENTION

The light emitting device of the present invention has a light emitting chip and a first layer covering the light emitting chip. In particular, the light emitting device is characterized by a second layer of light scattering material provided at least on top of the first layer, and by the surface of the second layer having a plurality of protrusions, which follow the topology of light scattering material.

As a result, when light from an external source shines on the device, glare at least above the first layer can be reduced. Therefore, no unpleasant sensation is given to the observer, and display contrast loss can be drastically reduced. Further, light from inside the light emitting device can be scattered uniformly and emitted to the outside, and color mixing of light from inside light emitting devices can be improved.

The light emitting device has a package with a cavity, and the light emitting chip is disposed on the surface at the base of the package cavity. Further, the first layer is positioned at least within the cavity, and the upper surface of the first layer may be concave.

Still further, it is preferable for the second layer to be positioned at least over the concave surface of the first layer, and for the film thickness of the second layer to increase from the edges towards the center region.

It is preferable for the light scattering material to have particulate form. This enables the protrusions which scatter external light to be easily and reliably formed. In addition, light from the LED chip can be efficiently emitted to the outside.

The light scattering material included in the second layer may also be made up of transparent material covered with dark coloration. This results in a large reduction in display contrast loss due to irradiation by external light.

It is also preferable for the transparent material to also be insulating. In this way, even if the coloration is conducting, short circuits can be effectively prevented.

It is preferable for particulate light scattering material included in the second layer to have an average particle size of 10 $\mu$m to 20 $\mu$m, and it is preferable for the film thickness of the second layer to be 1 $\mu$m to 10 $\mu$m.

The display apparatus of the present invention is characterized by an arrayed structure of light emitting devices disposed on a substrate.

It is preferable to provide the second layer not only over the surface of the first layer of light emitting devices, but also over the surface of the substrate.

Each light emitting device is mounted on the substrate via conducting material, and the conducting material is positioned at least outside the light emitting device from an observer's viewpoint. The surface of this conducting material located outside the light emitting device can be covered by the second layer. By doing this, reflection of external light off the surface of conducting material located outside the light emitting device can be reduced. Further, short circuiting or open circuiting of the conducting material located outside the light emitting device can be prevented.

The display apparatus method of manufacture of the present invention is a method of manufacture of a display apparatus with an array of light emitting devices on a substrate, and each light emitting device has a light emitting chip and a first layer covering that chip. In particular, light emitting devices are disposed in an array on a substrate to form a display apparatus. The method of manufacture is characterized by including a step to then form a second layer with light scattering material over at least the surface of the first layer of each light emitting device and the substrate surface on the observer's side of the display apparatus. In this manner, manufacturing efficiency can be greatly improved.

From the above description, it follows that light reflection at least from the surface of the first layer can be reduced by the light emitting device of the present invention. Since glare from the surface of the light emitting device can be reduced, display contrast loss can be reduced, and the quality of the unit as a light emitting device can be maintained. Further, in the display apparatus of the present invention, reflection of external light can be reduced at least at the surface of the first layer of each light emitting device and at the surface of the substrate. Since this can reduce glare and white appearance of the display, display contrast loss can be reduced, and a display apparatus with excellent visual appeal can be obtained. Since glare from external light off of the light emitting device and display apparatus surfaces as well as white appearance of the display are minimized even in the non-light emitting state, quality as light emitting devices and as a display apparatus is maintained.

DETAILED DESCRIPTION OF THE INVENTION

The following describes in detail a light emitting device and light emitting device display apparatus related to the present invention based on the drawings. However, the form of the following embodiments are intended as examples of a light emitting device and display apparatus that are representative of the technology behind the present invention, and the light emitting device and display apparatus of the present invention are not limited to the following embodiments. Further, the size and relative position, etc. of elements shown in each drawing may be exaggerated for the purpose of descriptive clarity. Although the light emitting device of the present invention is not limited to a specific device, the light emitting device in the following embodiments is described using a light emitting diode (LED) as an example.

Figure 3:
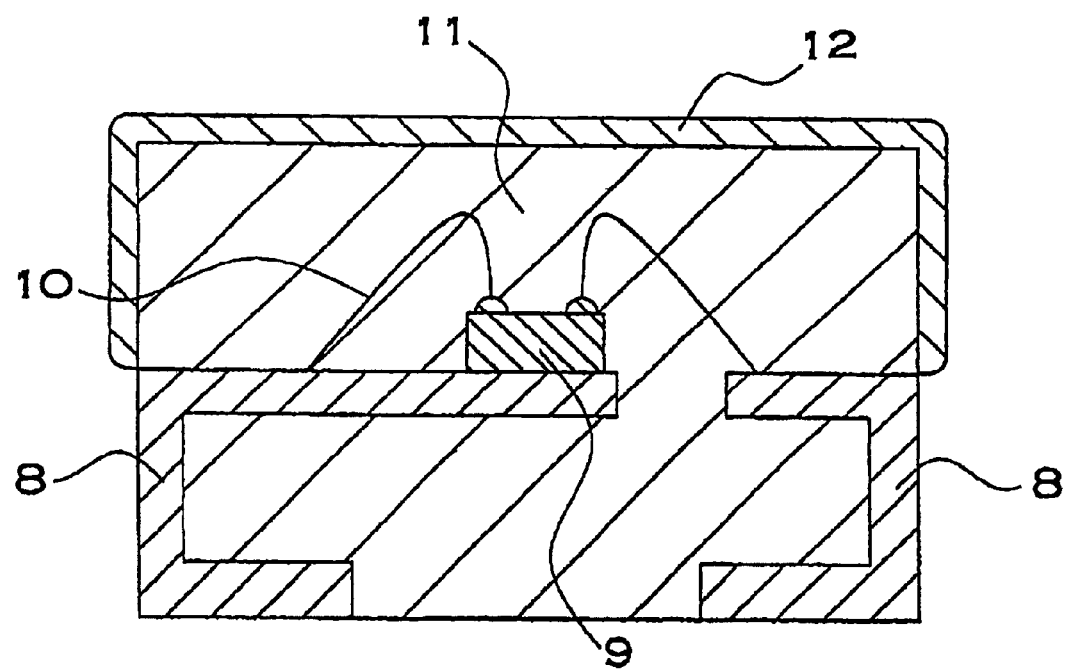
FIG. 3 is a cross-sectional view showing the structure of another light emitting device related to an embodiment of the present invention.
Figure 4:
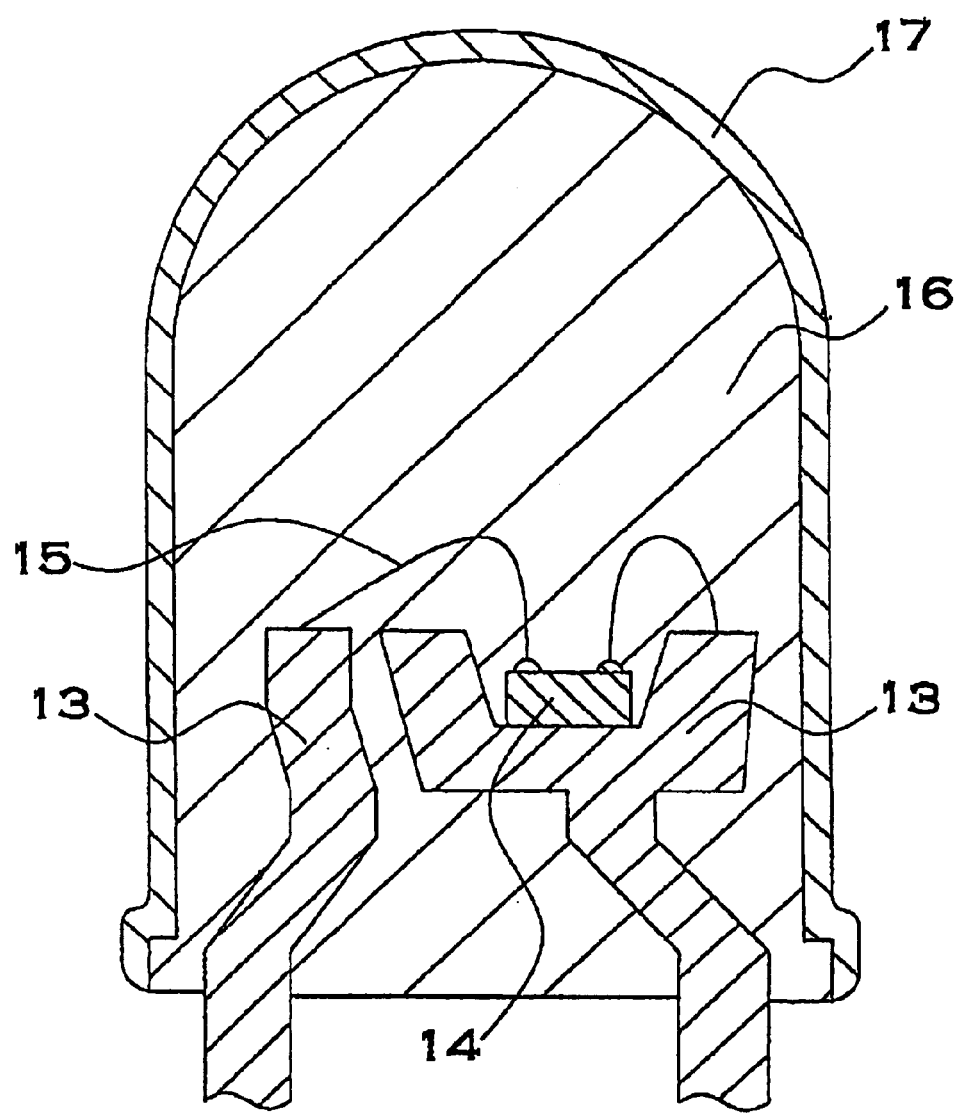
FIG. 4 is a cross-sectional view showing the structure of another light emitting device related to an embodiment of the present invention.
Figure 5:
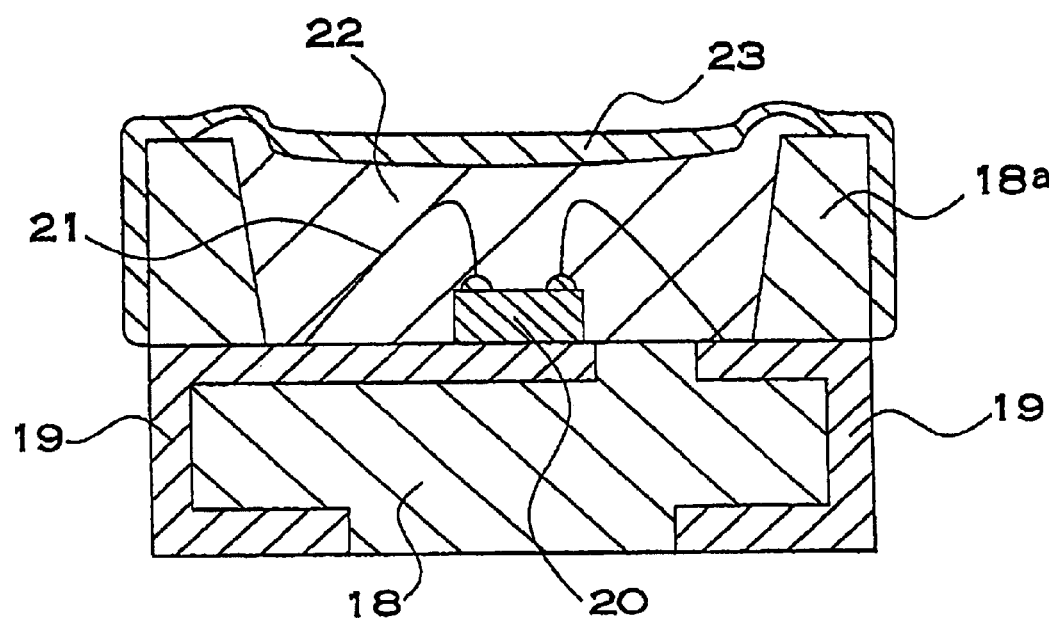
FIG. 5 is a cross-sectional view showing the structure of another light emitting device related to an embodiment of the present invention.

LED's with leads which can mount on the surface of a substrate, and LED's with leads that pass through the substrate for attachment are available. In the present embodiments, FIGS. 1, 3, and 5 show chip-type LED's which are used as LED's with leads which can surface mount on a substrate, and FIG. 4 shows a lamp-type LED used as an LED with leads which pass through the substrate for attachment.

Figure 1:
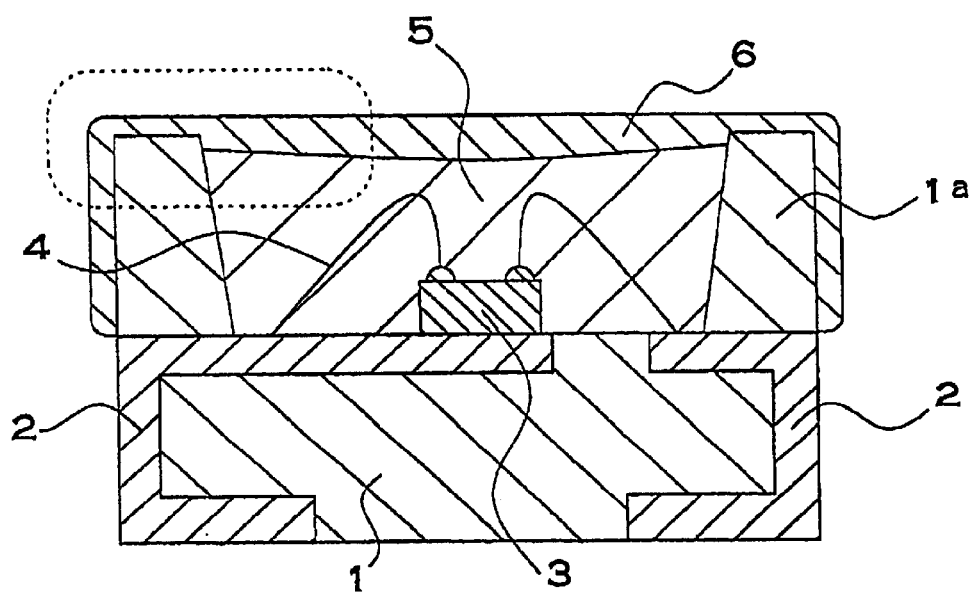
FIG. 1 is a cross-sectional view showing the structure of a light emitting device related to an embodiment of the present invention.

First, a chip-type LED provided with a package as shown in FIG. 1 is described. The LED of FIG. 1 has an LED chip 3 die-bonded to the surface at the bottom of a cavity in a package 1 formed, for example, from a liquid crystal polymer in which leads 2 are buried. After wire-bonding as necessary with wire 4 such as gold wire, encapsulating resin is introduced into the cavity to form the first layer 5 covering at least the LED chip 3. The package 1 is provided with side-walls 1a which form the cavity into which encapsulating resin is introduced. In addition, the LED is provided with a second layer 6, which has light scattering material 7, at least over the first layer 5.

Here, the second layer 6 is formed not only on the surface of the first layer 5, but also continuously over the upper and side surfaces of the sidewalls 1a. The second layer 6 may also be formed over part of the leads 2 exposed from the sides of the LED on the observer's side. In this application, upper surfaces are positioned on the side towards the observer.

Figure 2:
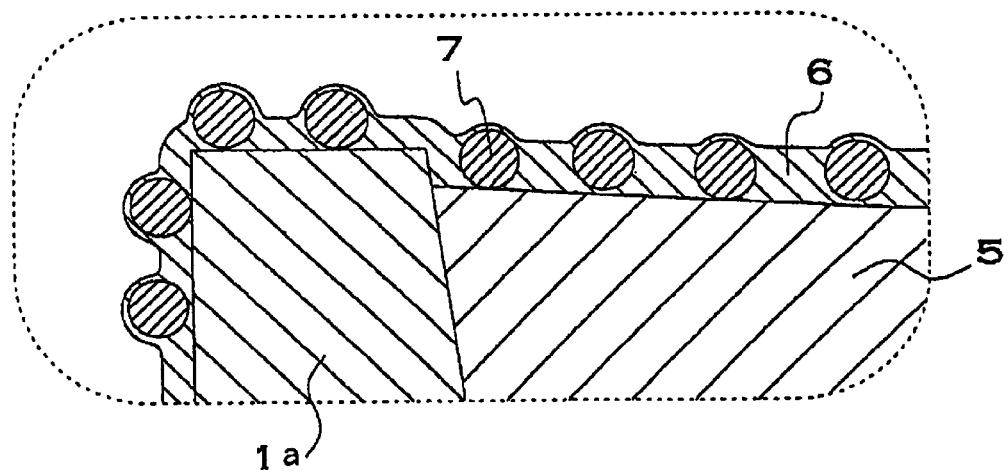
FIG. 2 is an enlarged view of the region of FIG. 1 inside the broken lines.

FIG. 2 shows a magnified view of the region inside the broken line border of FIG. 1. As shown here, the surface of the second layer 6 has a plurality of protrusions following the light scattering material. In this fashion, glare from external light can be reduced, and light from inside the LED can be uniformly scattered and emitted to the outside. Further, by virtue of the second layer having protrusions which follow the light scattering material, color mixing of light from within LED's can be improved.

Here, it is preferable for the light scattering material 7 to be of a particulate form. In the present invention, particulate form implies circular cross-sections, that is, roughly spherical form. As a result, a plurality of protrusions can be formed easily and reliably on the surface of the second layer.

By using a particulate form of light scattering material, the fluidity of the light scattering material inside the second layer can be improved. Therefore, light scattering material can be arranged within the second layer without uneven distribution, and formation of the second layer itself is made easy. Of course, the form of the light scattering material in the second layer may also have any of the cross-sectional shapes which can achieve a certain degree of fluidity, such as elliptical or polygonal. Further, for any of the above light scattering material shapes, the surfaces of the light scattering material particles may be micro-roughened, for example, as a result of some processing step.

At a protrusion in the second layer, it is not necessary to completely cover the entire light scattering material particle with the second layer material. Part of the light scattering material particle may be exposed from the second layer to the degree that it does not peel off the second layer.

It is also preferable for second layer 6 film thickness to be 1 $\mu$m to 10 $\mu$m, and for average particle diameter of the particulate light scattering material 7 to be 10 $\mu$m to 20 $\mu$m. This allows protrusions which follow the topology of light scattering material in the second layer to be easily formed. Here, film thickness implies the thickness of the second layer in regions of no protrusion formation, and not the thickness which includes a protrusion or a light scattering material particle covered with the second layer material.

Further, by using light scattering material of particulate form, and by making the second layer 6 film thickness 1 $\mu$m to 10 $\mu$m and average light scattering material 7 particle diameter 10 $\mu$m to 20 $\mu$m, light scattering material 7 particles can be positioned in a planar fashion at least over the surface of the first layer without piling up in a direction perpendicular to the surface of the first layer. Since this results in almost all light scattering material particles forming protrusions, external light can be efficiently diffused. In addition, by making the second layer 6 as thin as possible to form protrusions following the light scattering material 7 topology, reduction in light output (luminance) from the LED chip 3 can be controlled to the maximum degree.

It is also preferable for the refractive index of the second layer 6 to be smaller than the refractive index of the first layer 5. Specifically, it is preferable for the refractive index of the LED chip 3 (more specifically, the refractive indices of each component material of the LED chip 3), the refractive index of the first layer 5, the refractive index of the second layer 6, and the refractive index of the ambient region in contact with the second layer 6 to gradually decrease from the LED chip 3. In this manner, since the degree of total reflection due to differences in refractive index at each interface is reduced, emission efficiency of light from the LED chip 3 to the outside can be improved. Namely, luminance can be improved.

The following describes the case where the relation between second layer 6 film thickness, 1 $\mu$m to 10 $\mu$m, and average light scattering material 7 particle diameter, 10 $\mu$m to 20 $\mu$m, is not held. For example, if average light scattering material 7 particle diameter only is increased, the undesirable possibility of light scattering material 7 peeling away from the second layer 6 develops. Namely, the formation of the second layer 6 including light scattering material becomes difficult in itself. If film thickness of the second layer 6 only is increased, not only does it become difficult to form protrusions to scatter external light, but light emission efficiency drops radically due to the formation of a thicker than necessary second layer 6. Further, if the second layer 6 film thickness and the average light scattering material 7 particle diameter are both decreased keeping the same ratio, external light scattering efficiency drops. If the second layer 6 film thickness and the average light scattering material 7 particle diameter are both increased keeping the same ratio, not only does external light scattering efficiency drop, but light emission efficiency also drops.

In summary, by maintaining the relation described above between the second layer 6 film thickness and the average light scattering material 7 particle diameter, protrusions of proper size for scattering external light are easily and reliably formed. Further, since the second layer film thickness is not increased beyond what is required, light from the LED chip 3 can be efficiently emitted towards the observer. The second layer 6 including light scattering material 7 can also be formed relatively easily.

In a chip-type LED provided with a package 1 as shown in FIG. 1, encapsulating resin is introduced into the package 1 cavity to form the first layer 5. However, when the encapsulating resin finally hardens, the top surface of the encapsulating resin can form a concave surface due to effects such as surface tension at the package side-walls 1a. In general, when the encapsulating resin has a concave surface, reflected light is concentrated towards interior regions of the concave surface making interior regions of the concave surface appear white to an observer. However, reflection of external light off that surface can be drastically reduced by forming a second layer 6 having a plurality of protrusions at least over the concave surface of the first layer 5. Here, a concave surface implies a surface which sags over a certain area from its edges towards its interior regions in crater-like fashion.

It is preferable for the second layer 6 formed over a first layer 5 having a concave surface to have film thickness which increases from the edges towards the center region. Specifically, by forming the second layer 6 over the concave first layer 5, second layer 6 material collects at the center of the concave surface and the slope of the second layer 6 can be made small. In particular, by forming the second layer 6 thin enough to form protrusions following light scattering material topology, this effect can be made greater. That is, since volume loss during hardening of the second layer 6 is less when the second layer 6 is made thin than when it is made thick, the slope of the second layer 6 can be made smaller than the slope of the first layer 5. Since the surface of the second layer 6 can be made approximately planar in this fashion, concentration of external light near the center of the concave surface can be greatly reduced.

Incidentally, for LED's provided with packages, a cavity is formed by side-walls provided in the package. In the case of an LED with this type of package, for example, as shown in FIG. 5, encapsulating resin of the first layer 22 can creep up the side-walls 18a due to use of excessive encapsulating resin and effects such as surface tension during cavity filling with first layer 22 encapsulating resin. Encapsulating resin can extend to the upper surface of the side-walls 18a and can often protrude above that surface. As a result, a continuous encapsulating resin protrusion is formed along the upper surface of the side-walls 18a. From the observer's point of view, the edges of the upper surface of the first layer swell outward. Consequently, edges of the LED upper surface show particular glare when irradiated by external light. Again by forming a second layer over the first layer including the protruding edge regions, glare from the upper surface of the LED can be effectively reduced. Further, by forming a second layer 23 including light scattering material over the first layer 22, light emitted from the LED chip 20, disposed at the base of the package 18 cavity, which is misdirected to shine away from the observer by passing through first layer 22 material on the side-wall 18a upper surface, can be reduced. Similar to FIGS. 1 and 3, LED chips 20 is bonded at the base of a package 18 cavity in which leads 19 are buried, and necessary wire-bonding with wire 21 is performed.

LED's provided with a package as shown in FIGS. 1 and 5 have been described. However, a second layer can also be formed on LED's not provided with a package as shown in FIG. 3. Since the leads 8 and the LED chip 9 of an LED after wire-bonding as necessary with wire 10, with no package are covered and fixed in place by only the first layer 11, without addition of the second layer 12, first layer 11 material is exposed not only at the upper surface of the LED, but also at its sides. The second layer 12 including light scattering material is formed at least over the upper surface of the first layer 11. Again, the surface of the second layer 12 has a structure with a plurality of protrusions which follow the topology of the light scattering material as shown in FIG. 2.

In the FIG. 3 example, the second layer 12 is formed continuously over the upper and side surfaces of the LED. As a result, reflection of external light can be reduced not only from the upper surface, but also from side surfaces. It is also advantageous to cover part of the leads 8 exposed at the sides of the LED towards the observer with the second layer 12.

An LED with no package has first layer 11 material, which passes light, disposed on side surfaces. Since external light can reflect not only off the upper surface but also off side surfaces to cause a white appearance, provision of the second layer 12 over upper and side surfaces is particularly effective for an LED with no package.

Chip-type LED's, as shown in FIGS. 1, 3, and 5, with leads that can be surface mounted on a substrate, have been described. However, lamp-type LED's, as shown in FIG. 4, with leads that pass through a substrate for attachment, can also be used. In a lamp-type LED, an LED chip 14 is die-bonded at the base of a cavity in one of the leads 13, wire-bonding with wire 15 is performed as necessary, then the LED chip 14 is covered with encapsulating resin to form the first layer 16, for example, in a bullet shape. Next, a second layer 17 including light scattering material is formed over the first layer 16 in the same fashion described previously. Again, the surface of the second layer 12 has a structure with a plurality of protrusions which follow the topology of the light scattering material as shown in FIG. 2.

In many LED's which can be surface mounted, leads are exposed from the sides to retain strength after surface mounting. When an LED is ultimately mounted on a substrate via a conducting material such as solder, to some degree that conducting material creeps up the leads exposed from the LED sides, and this assures surface mount strength. In addition, a certain height is required for leads positioned on the sides of an LED to insure the strength of the LED itself. As a result of these requirements, leads are exposed from the sides of an LED. In the worst case, for example, leads can be exposed to the atmosphere, moisture can attach to a lead, and corrosion can cause open circuiting of that lead.

Therefore, the second layer can be formed continuously over the top of the LED and part of the leads, which are exposed from the sides on the observer's side, while retaining lead exposure on the substrate side to the degree that surface mount strength is not reduced. When conducting material creeps up the leads during mounting, it is preferable for the entire leads to be covered either by the second layer material or by the conducting material.

Figure 6:
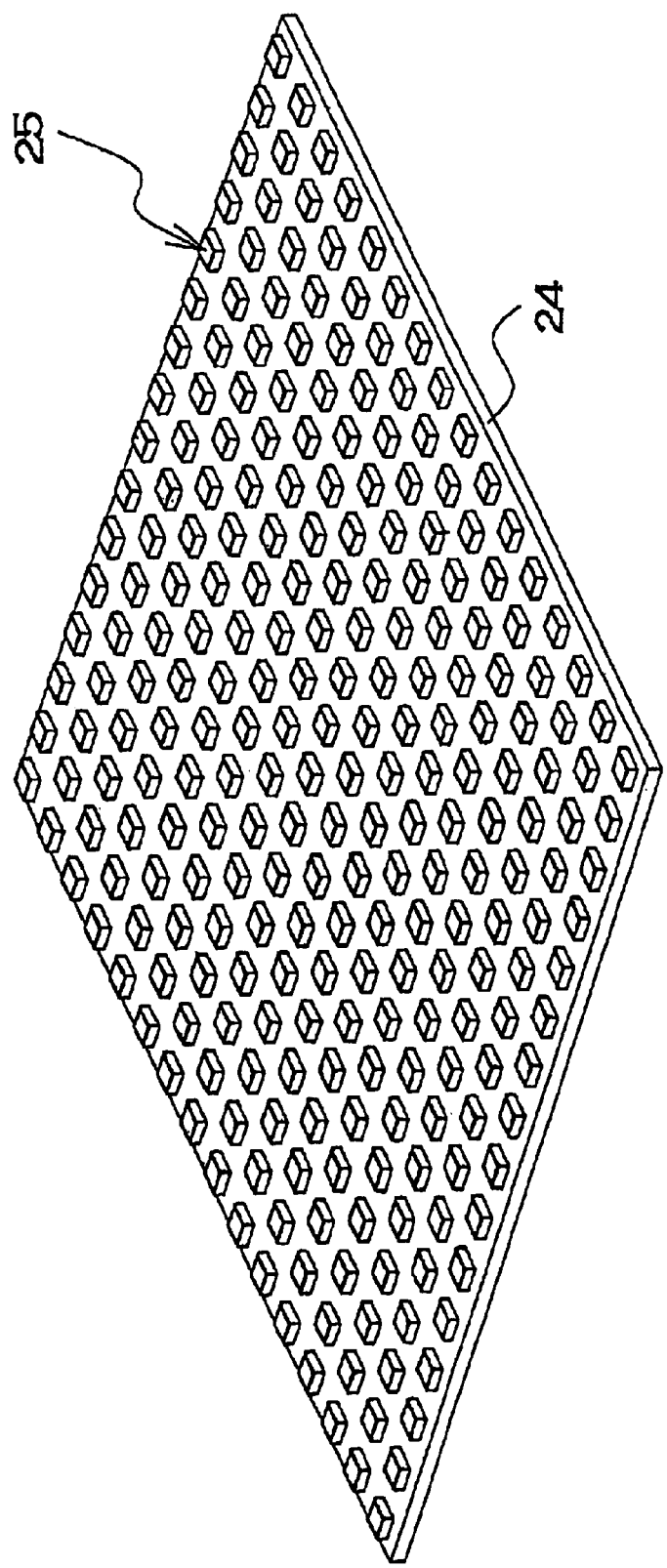
FIG. 6 is perspective view of the display apparatus related to an embodiment of the present invention.
Figure 7:
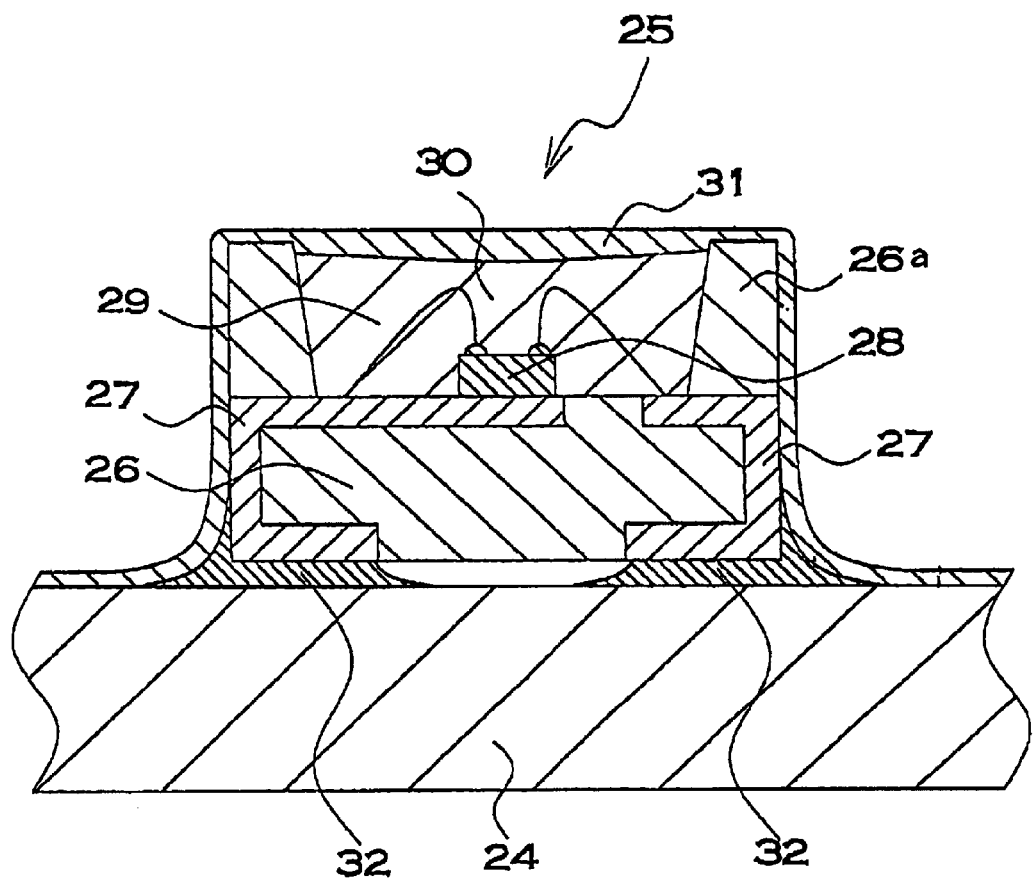
FIG. 7 is a cross-sectional view showing the structure of a display apparatus related to an embodiment of the present invention.

Next, the display apparatus of the present invention is described based on FIGS. 6 and 7. Although the display apparatus of the present invention is not restricted in type, the following favorable types of display apparatus are presented. These include an LED display apparatus with a pixel formed by two or more LED's selected from the RGB colors and pixels arranged on a substrate in an m-row by n-column array (where m and n are integers $\geq 1$), an LED display apparatus with a pixel formed by an LED containing two or more LED chips selected from the RGB colors and arranged on a substrate in an m-row by n-column array (where m and n are integers ≧1), and an LED display apparatus with LED's of a single color arranged on a substrate in an m-row by n-column array (where m and n are integers ≧1).

Here, an example is described using chip-type LED's 25, which can be surface mounted. First, a plurality of LED's 25 are arranged on a substrate 24 provided with conducting patterns corresponding to each LED. In each LED 25, the LED chip 28 is connected to leads 27 via bonding wires 29, and a first layer 30 of encapsulating resin is formed covering at least the LED chip 28. Further, both the upper surface of the first layer 30 and the substrate 24 are covered together by a second layer 31 with light scattering material. Again, the surface of the second layer 31 has a structure with a plurality of protrusions which follow the topology of the light scattering material as shown in FIG. 2.

Typically, the LED's 25 are connected to the substrate 24 via conducting material 32 such as solder. To assure attachment, in the case of the chip-type LED 25, conducting material 32 is formed in locations outside the LED 25 as seen by an observer. Therefore, it is preferable in the present invention to form the second layer 31 also over the surface of the conducting material 32.

Particularly in display apparatus used in outdoor applications, moisture can adhere to the surface of the conducting material 32. In the worst case this can result in short circuiting. Since at least direct contact with moisture is prevented by covering the surface of conducting material 32 with the second layer 31, short circuits due to this mechanism are effectively prevented in the present invention. In addition, corrosion can form on the conducting material 32, and in the worst case, the conducting material 32 can open circuit. Corrosion can also be effectively suppressed by forming the second layer 31 over the surface of the conducting material 32. Finally, reflection of external light off the surface of the conducting material 32 can be effectively reduced by forming the second layer 31 over the surface of conducting material 32 such as solder.

Of course, short circuits and open circuits at leads 27 exposed from LED 25 sides and at substrate 24 conducting patterns can be effectively prevented by forming a protective second layer 31 over their surfaces. By covering all areas on the observer's side of the display apparatus with the second layer 31, external light reflection can be reduced over the entire display apparatus, and all areas of the display apparatus can also be effectively protected.

In the LED's and LED display apparatus described above, a second layer provided with a plurality of protrusions from its surface causes light from an external source to scatter. As a result, optical degradation due to external light can be drastically reduced at regions covered by the second layer. In summary, the second layer functions both as a protective layer and a glare eliminating layer.

The display apparatus of the present invention may also have a mask over the substrate. In the case of an LED display apparatus, a mask covers regions on the observer's side of the display apparatus outside LED regions, and the mask may be formed, for example, from polycarbonate resin. In this manner, regions covered by the mask can easily be protected from events such as external impacts. Further, by covering all regions of the display apparatus other than the LED's with the mask, LED display apparatus quality can be maintained. It is preferable to cover the surface of the mask with the second layer. In this way, external light reflection can be reduced not only at the LED upper surfaces but also at the surface of the mask, and LED display apparatus quality can be maintained.

Although the encapsulating resin of the first layer is not limited to a specific type, transparent resins such as epoxy resin and silicone resin are preferable.

Although the second layer is also not limited to a specific material, resins such as fluorine resin, acrylic resin, silicone resin, and urethane resin are preferable. In particular, by using fluorine resin, degradation of the light scattering material and the coloration described later can be greatly reduced, and LED discoloration can be effectively prevented. Here, fluorine resin refers to resin which includes at least fluorine in its molecular structure.

Although the light scattering material is also not limited to a specific material, inorganic materials such as silicon oxides (silica), titanium oxide, barium titanate, aluminum oxides, and organic materials such as acrylic resin, urethane resin, melamine resin, CTU guanine resin, and benzoguanine resin can be used with favorable results. As described later, light scattering material can also be other materials such as pigments and fluorescent materials covered with transparent material.

The second layer used in the light emitting devices and display apparatus described above may be colored with a dark color such as black. By doing this, display contrast can be radically improved. To color the second layer dark, it is preferable to form the light scattering material by covering a dark pigment with transparent material. With this type of structure, the function of both the light scattering material and the pigment can be realized in one type of material. Here, the transparent material is not limited to specific types, but organic materials such as acrylic resin, urethane resin, melamine resin, CTU guanine resin, and benzo-guanine resin are presented as favorable candidates. In addition, the transparent material is not limited to water-clear material. The transparent material includes material which the light from LED transmits at least partially, such as translucent material or colored material.

By including coloring material in the light scattering material in this manner, the type and amount of material included in the second layer can be minimized. This allows the light scattering material to be uniformly distributed when the second layer is formed, for example, by spraying. As a result, external light can be effectively diffused and light from an LED chip can be efficiently emitted. Further, by covering the pigment with transparent material, the particle diameter of the light scattering material itself can easily be maintained. Therefore, a plurality of protrusions can easily and reliably be formed in the surface of the second layer.

By including a pigment in the light scattering material, the light scattering material itself is colored with a dark color. Of course, it is also possible to color the second layer with a dark color by including pigment a in the second layer separate from the light scattering material. Further, the first layer can also be colored, and both the first and second layers can be colored.

In addition, pigments other than dark colors, such as RGB pigments can be used. Use of these types of pigments is not limited to single colors and a plurality of colors can be mixed and used. Of course, dark colored pigments may be mixed with pigments other than dark colors. In this manner, the LED itself can act as a light filter. Since the amount of external light which enters into the LED interior and is then re-emitted can be reduced compared to the amount of light which initially entered the LED interior, the white appearance of the LED itself from the observers perspective can be effectively suppressed.

By using an inorganic pigment with carbon black as its primary component for dark coloration, any degradation due to discoloration can be minimized. Specifically, inorganic pigment with carbon black as its primary component has excellent properties to prevent light degradation compared with organic pigments such as dyes. It is preferable to cover the pigment itself with an insulating transparent material when using a pigment with carbon black as its primary component.

Since carbon black is a good electrical conductor, short circuits are possible in the worst case if excessive amounts of conducting pigment are included in the second layer and the second layer is formed over the surface of conducing materials such as leads. By covering a conducting pigment such as carbon black with an insulating transparent material such as acrylic resin as described above, short circuits can be effectively prevented. Of course, even if conducting pigments are not covered by insulating light scattering material, they can be used by controlling their concentration to a level that will not cause short circuits.

Next, methods of forming the second layer are described. Any of the widely known methods of forming a second layer on an LED and LED display apparatus, such as spraying or dipping, can be used. In particular, spraying is used to form the second layer in the present invention, and is preferable because a thin 1 μm to 10 μm film can be easily formed on the LED and the LED display apparatus surfaces.

First, formation of a second layer on an LED only is described. In this case, it is preferable to form the second layer on the LED connected to a lead-frame, which will later form the leads. Since the LED is not yet cut from the lead-frame at this stage, and in the end leads must contact conducting material for mounting on a substrate, formation of the second layer on those lead regions must be prevented by a technique such as masking. By controlling the masked regions, the second layer can be formed not only on top of the LED, but also on its side surfaces. In addition, since the LED is not yet cut from the lead-frame at this stage and since a plurality of LED's are connected to one lead-frame, the second layer can be formed simultaneously on multiple LED's.

Here, a method of forming the second layer on multiple LED's connected to a lead-frame was described. Of course, after surface mounting the LED's to a substrate, only the tops of the LED's can be exposed, for example, by masking, and the second layer can be similarly formed on the exposed regions.

Next, formation of the second layer on both the LED's and substrate of an LED display apparatus is described. In this case, it is preferable to simultaneously form the second layer at least over the first layer and the substrate on the observer's side after arranging the LED's on the substrate to make the display apparatus. Of course, the second layer can also be formed separately on the LED's and on the substrate, and the LED's can subsequently be mounted on the substrate to make the display apparatus.

Fluorescent material can be included in the first layer or the second layer to fluoresce due to light from the LED chip. Any of the widely known fluorescent materials can be used. The wave length of light emitted from the LED chip is determined by the semi-conductor layer materials and the crystallization mix in the LED chip structure.

The light scattering material can also be made of fluorescent material covered by transparent material. Since the film thickness for a second layer, which covers the periphery of fluorescent material, can be made thinner than a second layer with no protrusions, absorption of light emitted to the outside from the light scattering material by the second layer can be greatly reduced. Namely, light emitted from the fluorescent material can be efficiently emitted to the outside.

As fluorescent material, for example, materials based on the cerium activated yttrium-aluminum oxide family of fluorescent materials can emit light when excited by light from an LED having a nitride family semiconductor light emitting layer. As specific fluorescent materials in the yttrium-aluminum oxide family, $YAlO_3:Ce$, $Y_3Al_5O_{12}:Ce$ (YAG:Ce), $Y_4Al_2O_9:Ce$, and their compounds are named. Further, at least one of the elements Ba, Sr, Mg, Ca, and Zn can be included in the fluorescent materials of the yttrium-aluminum oxide family. In addition, by including Si, crystal growth reactions can be suppressed and fluorescent material particles can be generated. Still further, part or all of the yttrium can be replaced by at least one element selected from the group of Lu, Sc, La, Gd, and Sm, or part or all of the aluminum can be replaced by one of the elements Ba, TI, or In.

The first layer and the second layer are not necessarily single layers and may be comprised of multiple layers. In addition, light scattering material of inorganic or organic material may be included in the first layer to improve light emission efficiency.

Second layer film thickness was measured by forming a second layer on a surface, subsequently scratching the second layer with a probe, and measuring film thickness with a surface roughness gage. Light scattering material average particle diameter is the average particle diameter measured by a subsieve-sizer based on the air transmission method as the fundamental principle.

EMBODIMENTS

First Embodiment

The first embodiment of the present invention is an LED display apparatus as shown in FIGS. 6 and 7. In this application, chip-type LED's are surface mounted on a 128 mm×128 mm (vertical×horizontal, from the observer's viewpoint) substrate in a 16 dot×16 dot (vertical×horizontal) array. Each LED is a 3 mm×3 mm×1.8 mm (vertical×horizontal×height) full-color chip-type LED with three LED chips which can emit each of the RGB colors disposed at the base of single package cavity.

In the first embodiment, after mounting chip-type LED's 25 on the substrate 24, a second layer 31 is formed over chip-type LED 25 upper surfaces and over the substrate 24 upper surface by spray application to a film thickness of 1 μm to 10 μm of fluoride resin, which includes silica with average particle diameter of 5 μm to 10 μm and acrylic resin with average particle diameter of 15 μm.

The silica and acrylic resin are both particulate in form with approximately spherical particles and their indices of refraction are 1.45 and 1.50 respectively. The index of refraction of the fluoride resin is 1.41.

The LED display apparatus of the first embodiment, as shown in FIG. 7, uses a conducting material 32, namely solder, to mount the chip-type LED's 25 in an array on the substrate 24. In each chip-type LED 25, a package 26 with side-walls 26a is provided, and these side-walls 26a form a cavity to hold the LED chips 28. The LED chips 28 are die-bonded to the base of the cavity and connected to leads 27 via bonding wires 29. Encapsulating resin comprising the first layer is introduced into the package 26 cavity in a manner covering the LED chips 28. In the present embodiment, epoxy resin with an index of refraction of 1.54 is used as the encapsulating resin comprising the first layer.

Experimental data for the display apparatus of the first embodiment is shown in the following table. Experimental data includes the chromaticity coordinates and luminosity when all RGB LED's are illuminated for white emission, chromaticity coordinates and luminosity for only R light emission, chromaticity coordinates and luminosity for only G light emission, and chromaticity coordinates and luminosity for only B light emission. Here, the chromaticity coordinates are x-coordinates and y-coordinates measured based on the CIE (International Illumination Committee) chromaticity chart.

|  | x | y | luminance (cd/m$^2$) |
|---|---|---|---|
| White | 0.3069 | 0.3189 | 1000.3 |
| Red | 0.5901 | 0.3684 | 385.2 |
| Green | 0.2940 | 0.6172 | 705.9 |
| Blue | 0.2134 | 0.1423 | 249.8 |

Further, dark luminance was measured for the LED display apparatus of the first embodiment. Specifically, all LED's were turned off, light was shined from a 45° angle above the display front surface, and with a brightness of 5000 lx at the display surface the dark luminance indicating the degree of reflection was measured at 165.9 cd/m$^2$.

Second Embodiment

Other than formation of a second layer with film thickness 10 μm to 20 μm, this embodiment is the same as the first embodiment. Formation of the second layer was achieved by repeating the method of formation described for the first embodiment twice.

Experimental data for the display apparatus of the second embodiment is shown in the following table. Again, experimental data includes the chromaticity coordinates and luminosity when all RGB LED's are illuminated for white emission, chromaticity coordinates and luminosity for only R light emission, chromaticity coordinates and luminosity for only G light emission, and chromaticity coordinates and luminosity for only B light emission.

|  | x | y | luminance (cd/m$^2$) |
|---|---|---|---|
| White | 0.3076 | 0.3185 | 1005.0 |
| Red | 0.5878 | 0.3655 | 393.2 |
| Green | 0.2974 | 0.6114 | 713.1 |
| Blue | 0.2167 | 0.1455 | 259.5 |

Measuring dark luminance for the LED display apparatus of the second embodiment in the same manner as for first embodiment, dark luminance was 175.8 cd/m$^2$.

First Comparison Example

An LED display apparatus was fabricated for comparison purposes in the same manner as the first embodiment except that no second layer was formed.

Experimental data for the display apparatus of the first comparison example is shown in the following table. Again, experimental data includes the chromaticity coordinates and luminosity when all RGB LED's are illuminated for white emission, chromaticity coordinates and luminosity for only R light emission, chromaticity coordinates and luminosity for only G light emission, and chromaticity coordinates and luminosity for only B light emission.

|  | x | y | luminance (cd/m$^2$) |
|---|---|---|---|
| White | 0.3094 | 0.3183 | 991.5 |
| Red | 0.585 | 0.3657 | 394.8 |
| Green | 0.3044 | 0.6058 | 707.3 |
| Blue | 0.2211 | 0.1499 | 266.9 |

Measuring dark luminance for the LED display apparatus of the first comparison example in the same manner as for first embodiment, dark luminance was 184.2 cd/m$^2$.

As shown above, the chromaticity coordinates of each color for the LED display apparatus of the first embodiment and the second embodiment are essentially the same as those of the first comparison example. In addition, it is clear that dark luminance for the LED display apparatus of the first and second embodiments was 9.9% and 4.6%, respectively, lower than that of the first comparison example. Further, although second layers were formed on the LED display apparatus of the first and second embodiments, light output (luminance) was almost the same as that of the first comparison example.

It is also clear from experimental results for this LED display apparatus that the maximum reduction of surface reflection (dark luminance) was achieved for a second layer film thickness of 1 μm to 10 μm, while chromaticity coordinates and light output was essentially unchanged. In the case of the second embodiment where the second layer was formed by repeating layer formation twice, it is believed that protrusions, which reflect light from the surface of the second layer, were formed in excess.

Third Embodiment

In this embodiment, the same chip-type LED's used in the first embodiment are surface mounted on a 92 mm×128 mm (vertical×horizontal) substrate in a 12 dot×16 dot (vertical× horizontal) array to form the LED display apparatus.

In the third embodiment, after mounting chip-type LED's on the substrate, a second layer is formed over chip-type LED upper surfaces, side surfaces, and over the substrate upper surface by spray application to a film thickness of 2 μm to 5 μm of fluoride resin, which includes 11.0 wt % of light scattering material with an average particle diameter of 15 μm. In this embodiment, the second layer is colored black. Specifically, the light scattering material is formed by covering black pigment comprised of carbon black with acrylic resin. The light scattering material of this embodiment is particulate with approximately spherical shaped particles.

Experimental data for the display apparatus of the third embodiment is shown in the following table. Again, experimental data includes the chromaticity coordinates and luminosity when all RGB LED's are illuminated for white emission, chromaticity coordinates and luminosity for only R light emission, chromaticity coordinates and luminosity for only G light emission, and chromaticity coordinates and luminosity for only B light emission. In the LED display apparatus of the third embodiment, the LED driver mechanism for activating each LED is different than that for the display apparatus of the first embodiment. Therefore, the chromaticity and luminosity coordinates for each color in the third embodiment are naturally different from those of the first comparison example.

| | x | y | luminance (cd/m²) |
|---|---|---|---|
| White | 0.267 | 0.238 | 795 |
| Red | 0.660 | 0.340 | 231 |
| Green | 0.236 | 0.676 | 471 |
| Blue | 0.141 | 0.051 | 101 |

Further, dark luminance indicating the degree of reflection was measured at 5.21 cd/m² for the LED display apparatus of the third embodiment by shining light from a 45° angle above the display front surface and with a brightness of 100 lx at the display surface.

Second Comparison Example

An LED display apparatus was fabricated for comparison purposes in the same manner as the third embodiment except that no second layer was formed.

Experimental data for the display apparatus of the second comparison example is shown in the following table. Again, experimental data includes the chromaticity coordinates and luminosity when all RGB LED's are illuminated for white emission, chromaticity coordinates and luminosity for only R light emission, chromaticity coordinates and luminosity for only G light emission, and chromaticity coordinates and luminosity for only B light emission.

| | x | y | luminance (cd/m²) |
|---|---|---|---|
| White | 0.270 | 0.241 | 1069 |
| Red | 0.665 | 0.336 | 306 |
| Green | 0.239 | 0.675 | 635 |
| Blue | 0.141 | 0.052 | 135 |

Measuring dark luminance for the LED display apparatus of the second comparison example in the same manner as for third embodiment, dark luminance was 3.69 cd/m².

As shown above, the chromaticity coordinates of each color for the display apparatus of the third embodiment are essentially the same as those of the second comparison example. In addition, it is clear that dark luminance for the display apparatus of the third embodiment was 29.1% lower than that of the second comparison example. This is believed to be a result of including dark pigment in the light scattering material.

Although the third embodiment had lower luminance than the second comparison example, luminance can easily be improved to targeted levels by increasing the current supplied to each LED. In general, the LED has higher luminance than other light sources, and in actual practice, current may be controlled to suppress luminance. In some cases, luminance can remain above the target level even after current has been reduced as low as possible. From these practical considerations, it is clear that LED luminance alone can be increased relatively easily.

Accordingly, in the LED display apparatus of embodiment 3, to maintain respective RGB LED's at 1600 cd/m², the current in each RGB LED can be increased by a factor of 1.2, 1.4, and 1.4, respectively, resulting in luminance equivalent to LED's with no second layer formation.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims.

What is claimed is:

1. A light emitting device comprising:

a package having a cavity which is formed by side-walls of said package; and a light emitting chip disposed on a surface at the base of the cavity;

wherein, a layer including light scattering material is formed at least over upper surfaces of the side-walls of said package, and wherein a film thickness of the layer including the light scattering material is less than a particle diameter of the light scattering material, and at least a surface of the layer including the light scattering material formed over the upper surfaces of the side-walls of said package has protrusions that follow the topology of the light scattering material.

2. The light emitting device according to claim 1, wherein the light scattering material includes at least one of fluorescent material and pigment.

3. The light emitting device according to claim 2, wherein the light scattering material is made up of at least one of the fluorescent material and the pigment covered with transparent material.

4. The light emitting device according to claim 3, wherein the transparent material is made of organic material.

5. The light emitting device according to claim 2, wherein the fluorescent material is a yttrium-aluminum oxide family of fluorescent materials.

6. The light emitting device according to claim 2, wherein the fluorescent material is selected from the group consisting of a yttrium-aluminum oxide family of fluorescent materials and a fluorescent material wherein part or all of the yttrium in the yttrium-aluminum oxide family is replaced by at least one other element.

7. The light emitting device according to claim 5, wherein the yttrium in the yttrium-aluminum oxide family of fluorescent materials includes at least one of the elements selected from the group consisting of Ba, Sr, Mg, Ca, and Zn, or the yttrium in the yttrium-aluminum oxide family of fluorescent materials includes Si.

8. The light emitting device according to claim 1, wherein at least the film thickness of the layer including the light scattering material formed over the upper surfaces of the side-walls of said package is 1–10 µm, and the particle diameter of the light scattering material therein is 10–20 µm.

9. The light emitting device according to claim 6, wherein the at least one element which replaces part or all of the yttrium in the yttrium-aluminum oxide family of fluorescent materials is selected from the group consisting of Lu, Sc, La, Gd, and Sm.

* * * * *